United States Patent
Kumar

(10) Patent No.: US 10,644,703 B2
(45) Date of Patent: *May 5, 2020

(54) LEVEL SHIFTING CIRCUIT WITH CONDITIONAL BODY BIASING OF TRANSISTORS

(71) Applicant: STMicroelectronics International N.V., Schiphol (NL)

(72) Inventor: Ravinder Kumar, Ambala (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/430,923

(22) Filed: Jun. 4, 2019

(65) Prior Publication Data

US 2019/0326911 A1 Oct. 24, 2019

Related U.S. Application Data

(63) Continuation of application No. 15/961,214, filed on Apr. 24, 2018, now Pat. No. 10,355,694.

(51) Int. Cl.
*H03K 19/0185* (2006.01)
*H03K 19/20* (2006.01)

(52) U.S. Cl.
CPC ..... *H03K 19/018521* (2013.01); *H03K 19/20* (2013.01)

(58) Field of Classification Search
CPC .......... H03K 19/018521; H03K 19/20; H03K 19/018528
See application file for complete search history.

(56) References Cited

U.S. PATENT DOCUMENTS

| 6,097,113 | A | 8/2000 | Teraoka et al. |
| 7,521,762 | B2 | 4/2009 | Hidaka |
| 10,355,694 | B1 * | 7/2019 | Kumar ................... H03K 19/20 |

OTHER PUBLICATIONS

Lutkemeier, Sven et al: "A Subthreshold to Above-Threshold Level Shifter Comprising a Wilson Current Mirror," IEEE Transactions on Circuits and Systems—II: Express Briefs, vol. 57. No. 9, Sep. 2010, pp. 721-724.

* cited by examiner

*Primary Examiner* — Jung Kim
(74) *Attorney, Agent, or Firm* — Crowe & Dunlevy

(57) ABSTRACT

A level shifting circuit receives a first input signal and complement of the first input signal as inputs and generates a level shifted first output signal and complement of the first output signal as outputs. The level shifting circuit includes a number of transistors that support body biasing. One set of body bias signals applied to certain ones of those transistors is generated as a function of the logical combination of the first input signal and the first output signal. Another set of body bias signals applied to certain other ones of those transistors is generated as a function of the logical combination of the complement of the first input signal and the complement of the first output signal. The conditional body bias applied to the transistors of the level shifting circuit makes the circuit operational for level shift at very low supply voltage levels.

31 Claims, 5 Drawing Sheets

LEVEL SHIFTING CIRCUIT WITH CONDITIONAL BODY BIASING OF TRANSISTORS

CROSS-REFERENCE TO RELATED APPLICATIONS

This application is a continuation of United States Application for patent Ser. No. 15/961,214 filed Apr. 24, 2018, the disclosure of which is incorporated by reference.

TECHNICAL FIELD

The present invention relates to a level shifting circuit.

BACKGROUND

FIG. 1A shows a circuit diagram of a conventional level shifter circuit 10. The circuit 10 includes a first input transistor 12 and a second input transistor 14. The transistors 12 and 14 are n-channel MOSFET devices. The gate of the first input transistor 12 is configured to receive an input signal IN and the gate of the second input transistor 14 is configured to receive a complement input signal INN. The complementary input signals IN and INN are referenced to a first power supply domain with a positive voltage Vdd and a ground voltage Gnd. In this configuration, the complementary input signals IN and INN may be digital logic signals having a logic "1" voltage at the positive voltage Vdd and a logic "0" voltage at the ground voltage Gnd. The complement input signal INN may be generated from the input signal IN by a CMOS inverter circuit 18 that is powered at supply nodes from the Vdd and Gnd voltages. The body terminal of input transistor 12 is configured to receive the input signal IN and the body terminal of input transistor 14 is configured to receive the complement input signal INN.

The level shifter circuit 10 is powered from a second power supply domain with a positive voltage Vdde and a ground voltage Gnde. Source terminals of the transistors 12 and 14 are connected to a power supply node at the ground voltage Gnde. The drain terminal of the first input transistor 12 is connected to a complement output node OUTN and the drain terminal of the second input transistor 14 is connected to an output node OUT.

The level shifter circuit 10 further includes a pair of cross-coupled load transistors coupled through the output nodes OUT and OUTN to the first and second input transistors 12 and 14. More specifically, a first load transistor 22 has a drain terminal connected to the complement output node OUTN (and the drain of transistor 12) and a second load transistor 24 has a drain terminal connected to the output node OUT (and the drain of transistor 14). Source terminals of the transistors 22 and 24 are connected to a power supply node at the positive voltage Vdde. The gate of load transistor 22 is connected to the drain of load transistor 24 at the output node OUT, and gate of load transistor 24 is connected to the drain of load transistor 22 at the output node OUTN.

The level shifter circuit 10 operates to voltage shift the complementary input signals IN and INN from the first power supply domain to generate the complementary output signals at the output nodes OUT and OUTN in the second power supply domain. It is recognized, however, by those skilled in the art that the level shifter circuit 10 is not functional at very low supply voltage levels. At very low voltages of the first power supply domain, for example, below Vdd=0.45 V, the circuit is not able to level shift from low voltage to high voltage levels.

There is accordingly a need in the art for a level shifting circuit offering functionality when voltage shifting signals between power supply domains where the relatively lower level power supply domain uses a low voltage positive power supply voltage.

FIG. 1B shows a circuit diagram of a level shifter 50. See, for example, Lutkemeier, et al., "A Subthreshold to Above-Threshold Level Shifter Comprising a Wilson Current Mirror," IEEE Trans. on Circuits and Systems-II: Express Briefs, vol. 57. no. 9, 2010, FIG. 3 (incorporated by reference). The circuit 50 includes a first input transistor 52 and a second input transistor 54. The transistors 52 and 54 are n-channel MOSFET devices. The gate of the first input transistor 52 is configured to receive an input signal IN and the gate of the second input transistor 54 is configured to receive a complement input signal INN. The complementary input signals IN and INN are referenced to a first power supply domain with a positive voltage Vdd and a ground voltage Gnd. In this configuration, the complementary input signals IN and INN may be digital logic signals having a logic "1" voltage at the positive voltage Vdd and a logic "0" voltage at the ground voltage Gnd. The complement input signal INN may be generated from the input signal IN by a CMOS inverter circuit 58 that is powered at supply nodes from the Vdd and Gnd voltages.

The level shifter circuit 50 is powered from a second power supply domain with a positive voltage Vdde and a ground voltage Gnde. Source terminals of the transistors 52 and 54 are connected to a power supply node at the ground voltage Gnde. The drain terminal of the first input transistor 52 is connected to node 66 and the drain terminal of the second input transistor 54 is connected to node 68 which forms the output node OUT.

While the level shifter 10 of FIG. 1A used a latch circuit as the load for the input transistors, the level shifter 50 of FIG. 1B instead uses a Wilson current mirror 70 as the load. The current mirror 70 comprises a diode-connected p-channel MOSFET device 72 having a gate terminal connected to the gate terminal of a p-channel MOSFET device 74. Source terminals of the transistors 72 and 74 are connected to the positive voltage Vdde. The drain terminal of transistor 72 is coupled to the node 66 through the source-drain path of p-channel MOSFET device 74. The drain terminal of transistor 74 is coupled to the node 68. The Wilson current mirror 70 is operated in the overdrive region to ensure that no current flows through transistor 52 or 54 if that transistor is turned off.

The functionality of this circuit 50 similarly suffers when voltage shifting signals between power supply domains where the relatively lower level power supply domain uses a low voltage positive power supply voltage.

SUMMARY

In an embodiment, a circuit comprises: a level shifting circuit configured to receive a first input signal referenced to a first power supply domain and output a first output signal referenced to a second power supply domain, wherein the level shifting circuit includes a first input transistor having a gate terminal receiving the first input signal and having a body terminal configured to receive a first bias signal; and a bias generator having a first input configured to receive the first input signal and a second input configured to receive the first output signal, said bias generator configured to generate the first bias signal in response to a logical combination of the first input signal and first output signal.

In an embodiment, a circuit comprises: a level shifting circuit configured to receive a first input signal and a complement of the first input signal which are referenced to a first power supply domain and output a first output signal and a complement of the first output signal which are referenced to a second power supply domain, wherein the level shifting circuit includes a first input transistor having a gate terminal receiving the complement of the first input signal and having a body terminal configured to receive a first bias signal; and a bias generator having a first input configured to receive the complement of the first input signal and a second input configured to receive the complement of the first output signal, said bias generator configured to generate the first bias signal in response to a logical combination of the complement of the first input signal and complement of the first output signal.

In an embodiment, a circuit, comprising: a level shifting circuit configured to receive a first input signal and complement of the first input signal which are referenced to a first power supply domain and output a first output signal and a complement of the first output signal which are referenced to a second power supply domain, wherein the level shifting circuit includes: a first input transistor having a gate terminal receiving the first input signal and having a body terminal configured to receive a first bias signal; and a second input transistor having a gate terminal receiving the complement of the first input signal and having a body terminal configured to receive a second bias signal; and a bias generator configured to generate the first bias signal in response to a logical combination of the first input signal and first output signal and generate the second bias signal in response to a logical combination of the complement of the first input signal and the complement of the first output signal.

In an embodiment, a circuit comprises: a level shifting circuit configured to receive a first input signal referenced to a first power supply domain and output a first output signal referenced to a second power supply domain, wherein the level shifting circuit comprises: a first input transistor having a gate terminal receiving the first input signal; and a CMOS inverter circuit configured to generate said first output signal, said CMOS inverter circuit having an n-channel transistor with a body terminal configured to receive a first bias signal; and a bias generator having a first input configured to receive the first input signal and a second input configured to receive the first output signal, said bias generator configured to generate the first bias signal in response to a logical combination of the first input signal and the first output signal.

In an embodiment, a circuit comprises: a level shifting circuit configured to receive a first input signal and a complement of the first input signal which are referenced to a first power supply domain and output a first output signal and a complement of the first output signal which are referenced to a second power supply domain, wherein the level shifting circuit comprises: a first input transistor having a gate terminal receiving the complement of the first input signal; and a CMOS inverter circuit configured to generate said first output signal, said CMOS inverter circuit having a p-channel transistor with a body terminal configured to receive a complement of a first bias signal; and a bias generator having a first input configured to receive the complement of the first input signal and a second input configured to receive the complement of the first output signal, said bias generator configured to generate the first bias signal in response to a logical combination of the complement of the first input signal and the complement of the first output signal.

In an embodiment, a circuit comprises: a level shifting circuit configured to receive a first input signal referenced to a first power supply domain and output a first output signal referenced to a second power supply domain, wherein the level shifting circuit comprises: a first input transistor having a gate terminal receiving the first input signal; and a cascode transistor coupled in series with the first input transistor, said cascode transistor having a gate terminal coupled to receive the first output signal and having a body terminal configured to receive a first bias signal; and a bias generator having a first input configured to receive the first input signal and a second input configured to receive the first output signal, said bias generator configured to generate the first bias signal in response to a logical combination of the first input signal and the first output signal.

In an embodiment, a circuit comprises: a level shifting circuit configured to receive a first input signal and a complement of the first input signal which are referenced to a first power supply domain and output a first output signal and a complement of the first output signal which are referenced to a second power supply domain, wherein the level shifting circuit comprises: a first input transistor having a gate terminal receiving the complement of the first input signal; a current mirror circuit having a first leg coupled to the first input transistor and having a second leg; and a p-channel transistor having a gate terminal coupled to the first leg and a drain terminal coupled to the second leg, said p-channel transistor further having a body terminal configured to receive a complement of a first bias signal; and a bias generator having a first input configured to receive the complement of the first input signal and a second input configured to receive the complement of the first output signal, said bias generator configured to generate the first bias signal in response to a logical combination of the complement of the first input signal and the complement of the first output signal.

BRIEF DESCRIPTION OF THE DRAWINGS

For a better understanding of the embodiments, reference will now be made by way of example only to the accompanying figures in which.

DETAILED DESCRIPTION

Figure 1A:
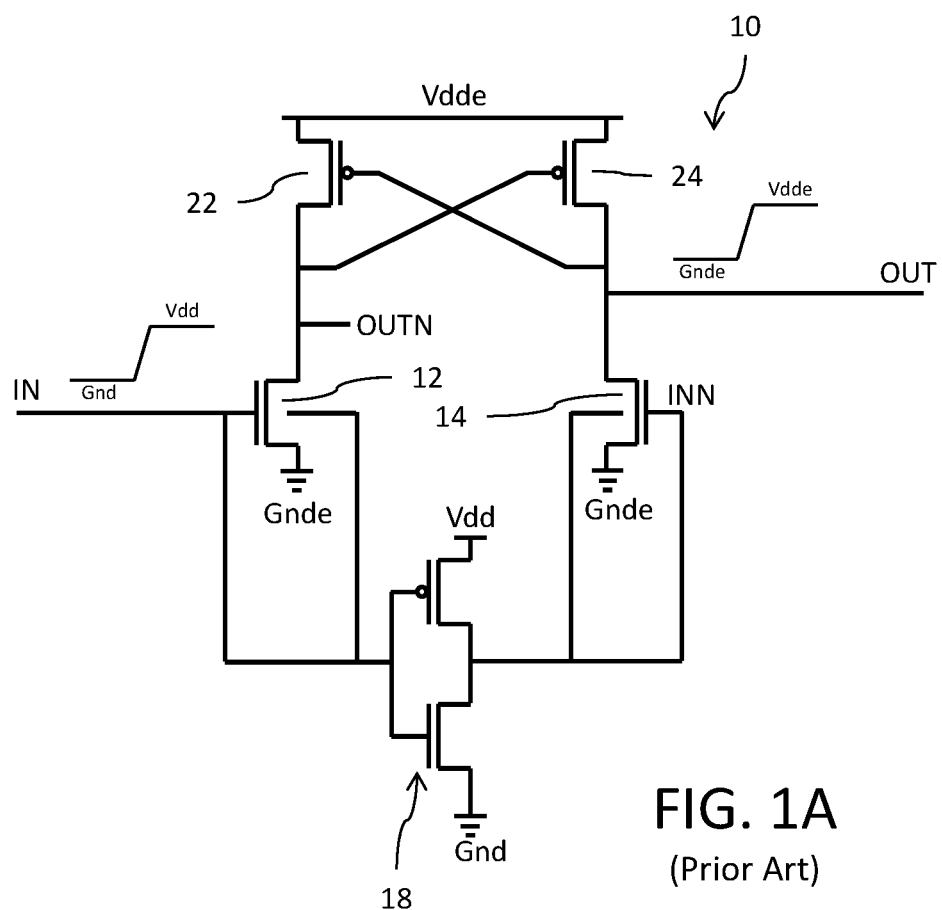
FIGS. 1A-1B show circuit diagrams of prior art level shifter circuits.
Figure 1B:
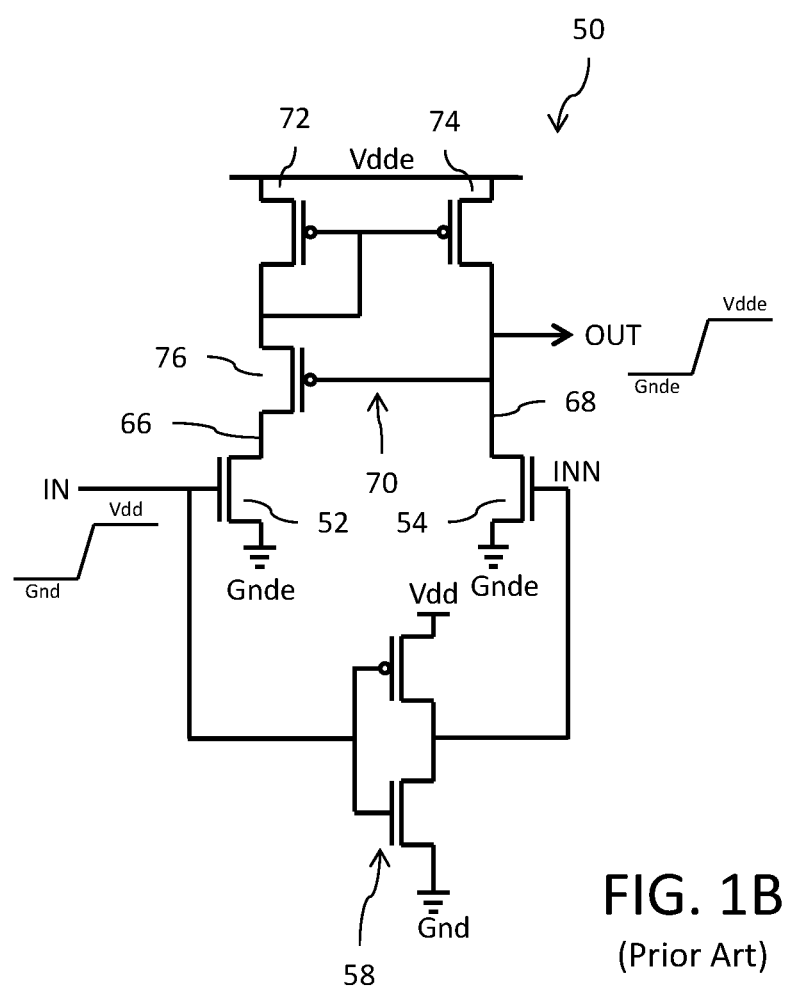
Figure 2:
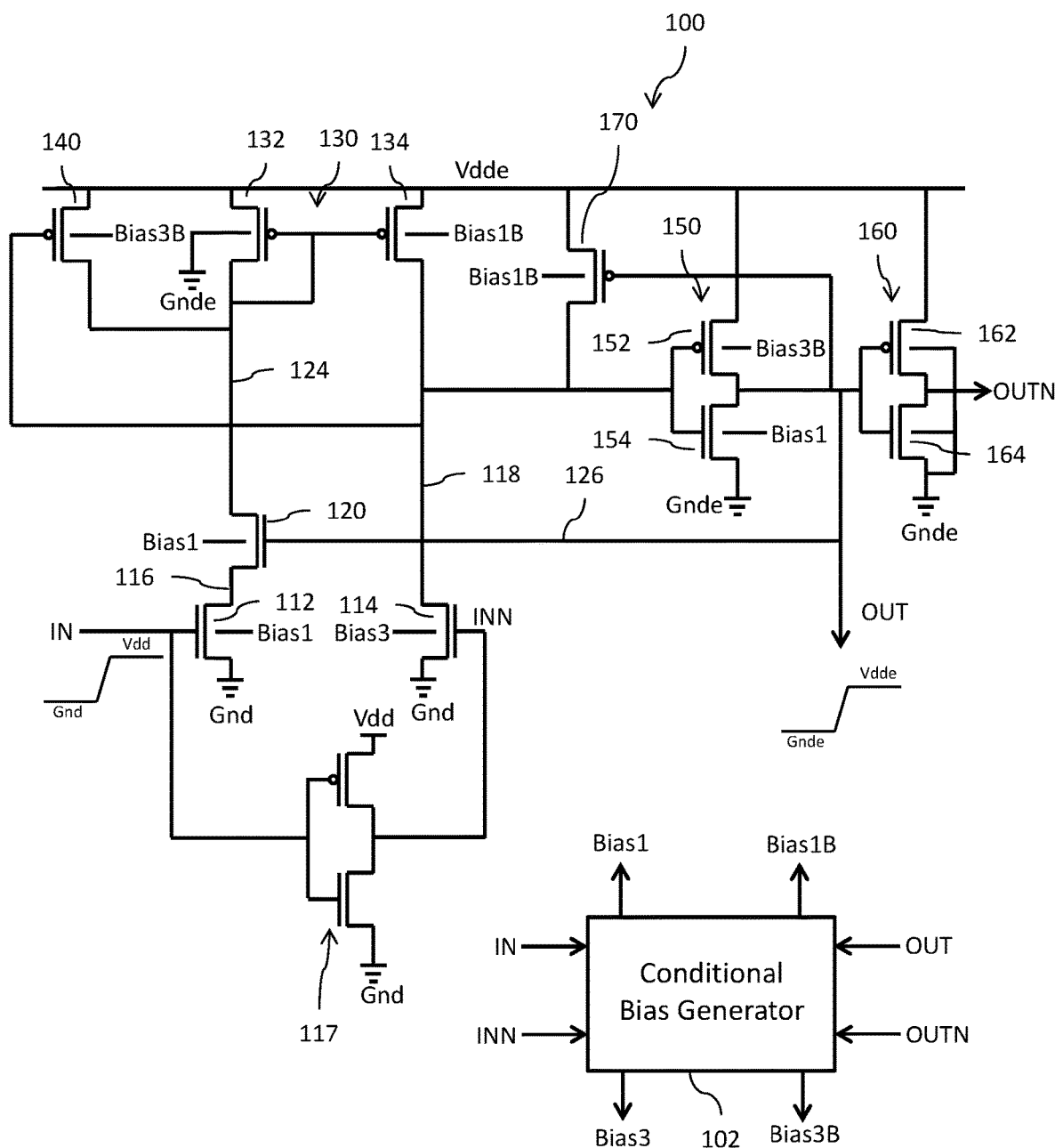
FIG. 2 is a circuit diagram of a level shifter circuit.

Reference is now made to FIG. 2 which shows a circuit diagram of a level shifter circuit 100 which includes transistors having body terminals that are conditionally biased by bias voltages generated by a bias voltage generator circuit 102. The circuit 100 includes a first input transistor 112 and a second input transistor 114. The transistors 112 and 114 are n-channel MOSFET devices. The gate of the first input transistor 112 is configured to receive an input signal IN and the gate of the second input transistor 114 is configured to receive a complement input signal INN. The complementary input signals IN and INN are referenced to a first power supply domain with a positive voltage Vdd and a ground voltage Gnd. In this configuration, the complementary input signals IN and INN may be digital logic signals having a logic "1" voltage at the positive voltage Vdd and a logic "0" voltage at the ground voltage Gnd. The complement input signal INN may be generated from the input signal IN by a CMOS inverter circuit 117 that is powered at power supply nodes from the Vdd and Gnd voltages.

The body terminal of input transistor 112 is configured to receive a bias voltage Bias 1 and the body terminal of input transistor 114 is configured to receive a bias voltage Bias3. Source terminals of the transistors 112 and 14 are connected to the power supply node at the ground voltage Gnd. The drain terminal of the first input transistor 112 is connected to node 116 and the drain terminal of the second input transistor 114 is connected to node 118.

The CMOS inverter circuit 117 includes a p-channel MOSFET device having a source terminal connected to the power supply node for the positive voltage Vdd, a gate terminal connected to receive the input signal IN and a drain terminal. The CMOS inverter circuit 117 further includes an n-channel MOSFET device having a source terminal connected to the power supply node for the ground voltage Gnd, a gate terminal connected to receive the input signal IN and a drain terminal connected to the drain terminal of the p-channel MOSFET device at an output of the CMOS inverter circuit 117 which produces the complement input signal INN.

The level shifter circuit 100 includes a cascode transistor 120 coupled in series with the first input transistor 112. The transistor 120 is an n-channel MOSFET device. A source terminal of transistor 120 is connected to the drain terminal of transistor 112 at node 116. A drain terminal of transistor 120 is connected to node 124. The body terminal of transistor 120 is configured to receive the bias voltage Bias1. The gate terminal of transistor 120 is connected to node 126.

Nodes 118 and 124 are connected to a current mirror circuit 130 having a first leg formed by transistor 132 and a second leg formed by transistor 134. The transistors 132 and 134 are p-channel MOSFET devices. A drain terminal of transistor 132 is connected to node 124 and to the gate terminal of transistors 132 and 134. A drain terminal of transistor 134 is connected to node 118. The source terminals of transistors 132 and 134 are connected to the power supply node at the positive voltage Vdde of a second power supply domain with the positive voltage Vdde and a ground voltage Gnde. The body terminal of transistor 132 is connected to receive the ground voltage Gnde. The body terminal of transistor 134 is configured to receive a bias voltage Bias1B.

The level shifter circuit 100 further includes a transistor 140. The transistor 140 is a p-channel MOSFET device. A drain terminal of transistor 140 is connected to node 124 and a source terminal of transistor 140 is connected to the power supply node for the positive voltage Vdde. A gate terminal of transistor 140 is connected to node 118. The body terminal of transistor 140 is configured to receive a bias voltage Bias3B.

A CMOS inverter circuit 150 has an input connected to node 118. The CMOS inverter circuit 150 includes a p-channel MOSFET device 152 having a source terminal connected to the power supply node for the positive voltage Vdde, a gate terminal connected to node 118 and a drain terminal. The CMOS inverter circuit 150 further includes an n-channel MOSFET device 154 having a source terminal connected to the power supply node for the ground voltage Gnde, a gate terminal connected to node 118 and a drain terminal connected to the drain terminal of the p-channel MOSFET device 152 at an output of the CMOS inverter circuit 150 which produces an output signal OUT. The body terminal of transistor 152 is configured to receive the bias voltage Bias3B. The body terminal of transistor 154 is configured to receive the bias voltage Bias1.

A CMOS inverter circuit 160 has an input connected to the output of CMOS inverter circuit 150. The CMOS inverter circuit 160 includes a p-channel MOSFET device 162 having a source terminal connected to the power supply node for the positive voltage Vdde, a gate terminal connected to the output of the CMOS inverter circuit 150 and a drain terminal. The CMOS inverter circuit 160 further includes an n-channel MOSFET device 164 having a source terminal connected to the power supply node for the ground voltage Gnde, a gate terminal connected to the output of the CMOS inverter circuit 150 and a drain terminal connected to the drain terminal of the p-channel MOSFET device 162 at an output of the CMOS inverter circuit 160. The output of the CMOS inverter circuit 160 forms an output of the level shifter circuit 100 which generates a complement output signal OUTN. The body terminals of transistors 162 and 164 are connected to the power supply node for the ground voltage Gnde.

The level shifter circuit 100 further includes a transistor 170. The transistor 170 is a p-channel MOSFET device. A drain terminal of transistor 170 is connected to node 118 and a source terminal of transistor 170 is connected to the power supply node for the positive voltage Vdde. A gate terminal of transistor 170 is connected to the output of the CMOS inverter circuit 150. The body terminal of transistor 170 is configured to receive a bias voltage Bias1B.

The bias voltage generator circuit 102 receives the IN and INN signals as well as the OUT and OUTN signals and generates the bias voltages Bias1, Bias1B, Bias3 and Bias3B in response to changes in the IN, INN, OUT and OUTN signals. Thus, the voltage levels for the bias voltages Bias1, Bias1B, Bias3 and Bias3B are conditioned on the states of the IN, INN, OUT and OUTN signals. More specifically, the bias voltages Bias1 and Bias1B are conditioned on the states of the IN and OUT signals, while the bias voltages Bias3 and Bias3B are conditioned on the states of the INN and OUTN signals. The signals for the bias voltages Bias1 and Bias1B are complementary. Likewise, the signals for the bias voltages Bias3 and Bias3B are complementary.

Figure 3:
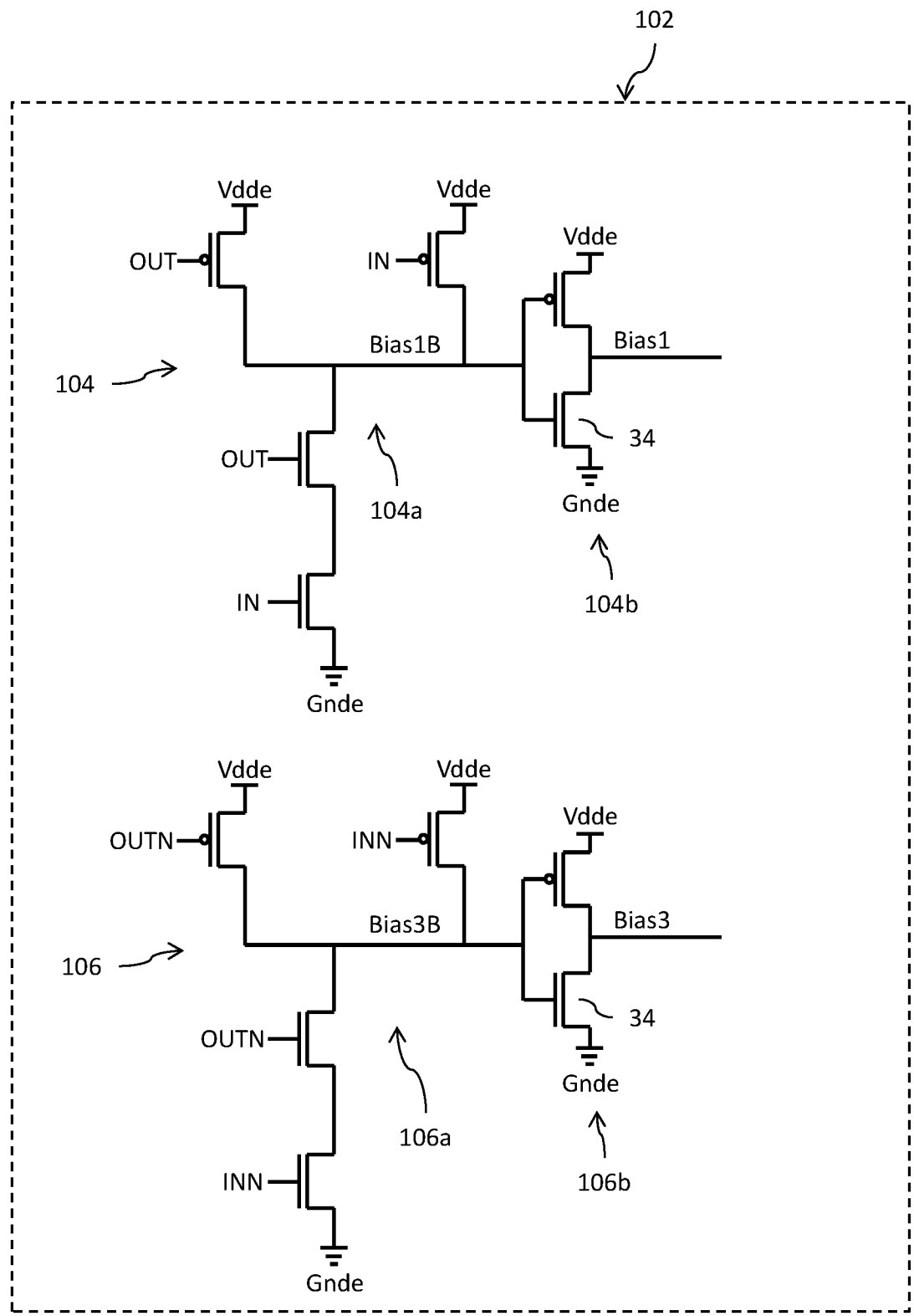
FIG. 3 is a circuit diagram for a bias voltage generator circuit used to generate body bias voltages for transistors within the level shifter circuit of FIG. 2.

Reference is now made to FIG. 3 which shows a circuit diagram for the bias voltage generator circuit 102. The bias voltage generator circuit 102 may be configured as a logic circuit including first logic circuitry 104 to logically combine the IN and OUT signals to generate the signals for the bias voltages Bias1 and Bias1B and second logic circuitry 106 to logically combine the INN and OUTN signals to generate the signals for the bias voltages Bias3 and Bias3B.

The first logic circuitry 104 includes a two input CMOS logic NAND gate 104a that receives the IN and OUT signals and generates the signal for the bias voltage Bias1B coupled in series with a CMOS logic inverter gate 104b that receives the signal for the bias voltage Bias1B and generates the signal for the bias voltage Bias1. Thus, the bias voltage Bias1B is generated as the logical NAND combination of the IN and OUT signals, and the bias voltage Bias1 is generated as the logical AND combination of the IN and OUT signals.

The second logic circuitry 106 includes a two input CMOS logic NAND gate 106a that receives the INN and OUTN signals and generates the signal for the bias voltage Bias3B coupled in series with a CMOS logic inverter gate 106b that receives the signal for the bias voltage Bias3B and generates the signal for the bias voltage Bias3. Thus, the signal for the bias voltage Bias3B is generated as the logical NAND combination of the INN and OUTN signals, and the signal for the bias voltage Bias3 is generated as the logical AND combination of the INN and OUTN signals.

Figure 4A:
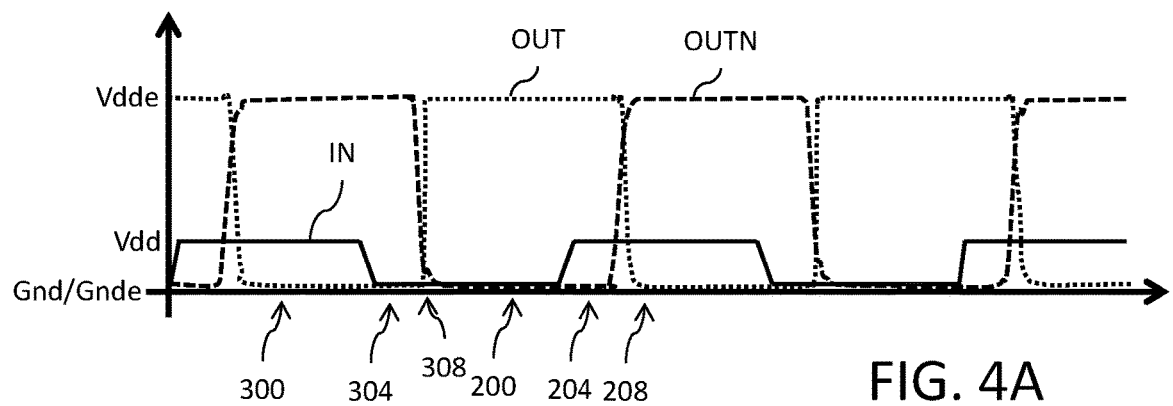
FIGS. 4A-4C are timing diagrams showing operation of the level shifter circuit of FIG. 2 and bias voltage generator circuit of FIG. 3.
Figure 4B:
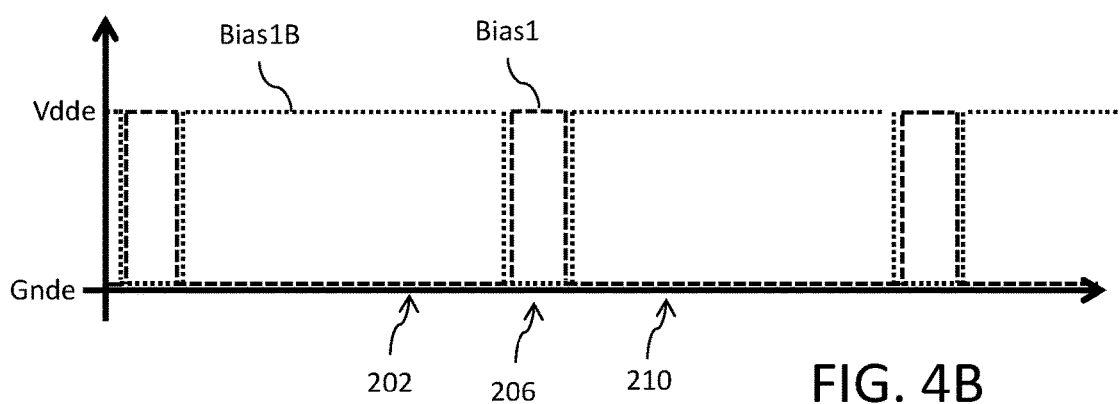
Figure 4C:
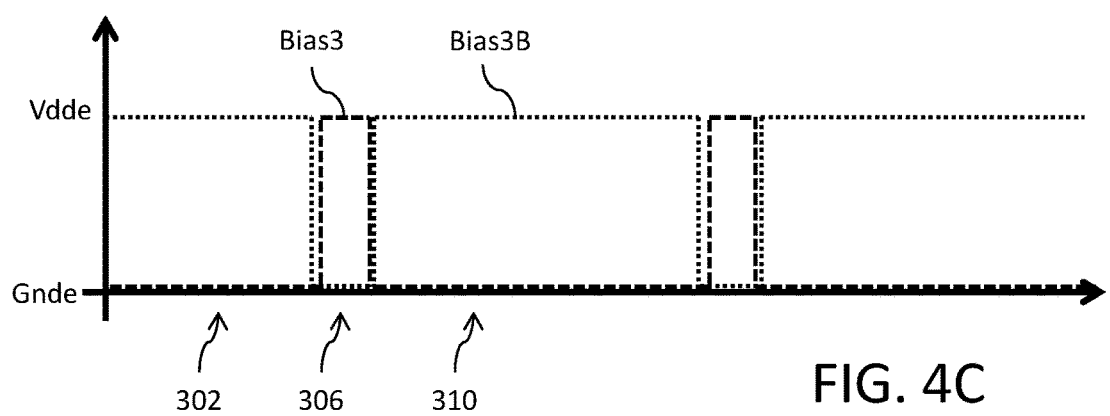

A better understand of the operation of the level shifter circuit of FIG. 2 and bias voltage generator circuit of FIG. 3 may be obtained by reference to FIGS. 4A-4C and following discussion:

Assume that the input signal IN is at the ground voltage Gnd (logic "0") and the output signal OUT is at the supply voltage Vdde (logic "1"). In this state (reference 200), the first logic circuitry 104 of the bias voltage generator circuit 102 will generate (reference 202) the signal for the bias voltage Bias1B at the supply voltage Vdde (from the logical NAND combination of the IN and OUT signals) and generate the signal for the bias voltage Bias1 at the ground voltage Gnde (from the logical AND combination of the IN and OUT signals). In response to a logic state transition of the IN signal from logic "0" to logic "1" (reference 204), the output signal OUT will, at the moment, still be at the supply voltage Vdde (logic "1"). So, the first logic circuitry 104 of the bias voltage generator circuit 102 will now generate (reference 206) the signal for the bias voltage Bias1B at the ground voltage Gnde (from the logical NAND combination of the IN and OUT signals) and generate the signal for the bias voltage Bias1 at the supply voltage Vdde (from the logical AND combination of the IN and OUT signals). This dynamic change in the body biasing of the transistors receiving the signals for the bias voltages Bias1 and Bias1B in response to the change of the input signal IN assists the operation of the level shifter circuit 100 to respond to the logic state transition of the IN signal and drive the output signal OUT to the ground voltage Gnde (logic "0") at reference 208. More specifically, the voltage levels of the signals for the bias voltages Bias1 and Bias1B that have been conditionally generated improve the operation of the transistors 112, 120, 134, 154 and 170 in connection with driving change in the output signal OUT. With the output signal OUT now at the ground voltage Gnde (logic "0") and the input signal IN at the supply voltage Vdd (logic "1"), the first logic circuitry 104 of the bias voltage generator circuit 102 will now generate (reference 210) the signal for the bias voltage Bias1B at the supply voltage Vdde (from the logical NAND combination of the IN and OUT signals) and generate the signal for the bias voltage Bias1 at the ground voltage Gnde (from the logical AND combination of the IN and OUT signals).

Now assume that the input signal IN is at the supply voltage Vdd (logic "1") and the output signal OUT is at the ground voltage Gnde (logic "0"). So, the input signal INN would be at the ground voltage Gnd (logic "0") and the output signal OUTN would be at the supply voltage Vdde (logic "1"). In this state (reference 300), the second logic circuitry 106 of the bias voltage generator circuit 102 will generate (reference 302) the signal for the bias voltage Bias3B at the supply voltage Vdde (from the logical NAND combination of the INN and OUTN signals) and generate the signal for the bias voltage Bias3 at the ground voltage Gnde (from the logical AND combination of the IN and OUT signals). In response to a logic state transition of the IN signal from logic "1" to logic "0" (reference 304), the output signal OUT will still, at the moment, be at the ground voltage Gnde (logic "0"); so, INN=1 and OUTN=1. The second logic circuitry 106 of the bias voltage generator circuit 102 will now drive (reference 306) the signal for the bias voltage Bias3B towards the ground voltage Gnde (from the logical NAND combination of the INN and OUTN signals) and generate the signal for the bias voltage Bias3 at the supply voltage Vdde (from the logical AND combination of the INN and OUTN signals). This dynamic change in the body biasing of the transistors receiving the signals for the bias voltages Bias3 and Bias3B assists the operation of the level shifter circuit 100 to respond to the logic state transition of the IN signal and drive the output signal OUT to the supply voltage Vdde (logic "1") at reference 308. More specifically, the voltage levels of the signals for the bias voltages Bias3 and Bias3B that have been conditionally generated improve the operation of the transistors 114, 140 and 152 in connection with driving change in the output signal OUT. With the output signal OUT now at the supply voltage Vdde (logic "1"), OUTN=0, and the input signal IN at the ground voltage Gnd (logic "0"), INN=1, the second logic circuitry 106 of the bias voltage generator circuit 102 will now generate (reference 310) the signal for the bias voltage Bias3B at the supply voltage Vdde (from the logical NAND combination of the INN and OUTN signals) and generate the signal for the bias voltage Bias3 at the ground voltage Gnde (from the logical AND combination of the INN and OUTN signals).

The advantages of the level shifter circuit 100 shown in FIG. 2 which includes transistors having body terminals that are conditionally biased by bias voltages provided by signals generated in response to the states and logic transitions of IN, INN, OUT and OUTN signals include: a) achieving functionality for level shift operation at very low supply voltage levels (Vdd=0.45V), b) an increased operating frequency with respect to first power supply domains having a relatively low supply voltage (for example, in the range of 0.45V to 0.6V); and c) a decrease in leakage current with respect to first power supply domains having a relatively low supply voltage (for example, in the range of 0.45V to 0.6V).

In a preferred implementation, the p-channel and n-channel transistors used in the level shifter are fabricated on a fully-depleted semiconductor on insulator (SOI) substrate that supports body biasing. It will be understood, however, that other types of substrates which can support body biasing could also be used.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
  a level shifting circuit configured to receive a first input signal referenced to a first power supply domain and output a first output signal referenced to a second power supply domain, wherein the level shifting circuit comprises:
    a first input transistor having a gate terminal receiving the first input signal; and
    a CMOS inverter circuit configured to generate said first output signal, said CMOS inverter circuit having an n-channel transistor with a body terminal configured to receive a first bias signal; and
  a bias generator having a first input configured to receive the first input signal and a second input configured to receive the first output signal, said bias generator configured to generate the first bias signal in response to a logical combination of the first input signal and the first output signal.

2. The circuit of claim 1, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

3. The circuit of claim 1, wherein the level shifting circuit further includes a p-channel transistor having a gate terminal coupled to receive the first output signal and a drain terminal coupled to an input of the CMOS inverter circuit, said p-channel transistor further having a body terminal configured to receive a complement of the first bias signal.

4. The circuit of claim 3, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

5. The circuit of claim 3, wherein the bias generator comprises a logic NAND gate configured to generate the first bias signal, the logic NAND gate receiving the first input signal and first output signal as inputs; and further comprising a logic inverter gate having an input coupled to an output of the logic NAND gate, the logic inverter configured to generate the complement of the first bias signal.

6. The circuit of claim 1, wherein the level shifting circuit further includes a current mirror circuit coupled to the first input transistor, said current mirror circuit including a transistor having a body terminal configured to receive a complement of the first bias signal.

7. The circuit of claim 6, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

8. The circuit of claim 6, wherein the bias generator comprises a logic NAND gate configured to generate the first bias signal, the logic NAND gate receiving the first input signal and first output signal as inputs; and further comprising a logic inverter gate having an input coupled to an output of the logic NAND gate, the logic inverter configured to generate the complement of the first bias signal.

9. The circuit of claim 1, wherein the level shifting circuit further includes a cascode transistor coupled in series with the first input transistor, said cascode transistor having a gate terminal coupled to receive the first output signal and having a body terminal configured to receive the first bias signal.

10. The circuit of claim 9, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

11. The circuit of claim 1, wherein the first bias signal is generated by a logic NAND gate receiving the first input signal and first output signal as inputs.

12. The circuit of claim 1, wherein the first input transistor has a body biased by the first bias signal.

13. A circuit, comprising:
a level shifting circuit configured to receive a first input signal and a complement of the first input signal which are referenced to a first power supply domain and output a first output signal and a complement of the first output signal which are referenced to a second power supply domain, wherein the level shifting circuit comprises:
a first input transistor having a gate terminal receiving the complement of the first input signal; and
a CMOS inverter circuit configured to generate said first output signal, said CMOS inverter circuit having a p-channel transistor with a body terminal configured to receive a complement of a first bias signal; and
a bias generator having a first input configured to receive the complement of the first input signal and a second input configured to receive the complement of the first output signal, said bias generator configured to generate the first bias signal in response to a logical combination of the complement of the first input signal and the complement of the first output signal.

14. The circuit of claim 13, wherein the bias generator operates to respond to a change in logic state of the first input signal by driving the first bias signal from a lower voltage level toward a higher voltage level for a duration of time which is terminated by a change in logic state of the complement of the first output signal, wherein after termination of said duration of time the bias generator operates to drive the first bias signal back to the lower voltage level.

15. The circuit of claim 13, wherein the level shifting circuit further includes:
a current mirror circuit having a first leg coupled to the first input transistor and having a second leg; and
a p-channel transistor having a gate terminal coupled to the first leg and a drain terminal coupled to the second leg, said p-channel transistor further having a body terminal configured to receive the complement of the first bias signal.

16. The circuit of claim 15, wherein the bias generator operates to respond to a change in logic state of the first input signal by driving the first bias signal from a lower voltage level toward a higher voltage level for a duration of time which is terminated by a change in logic state of the complement of the first output signal, wherein after termination of said duration of time the bias generator operates to drive the first bias signal back to the lower voltage level.

17. The circuit of claim 15, wherein the bias generator comprises a logic NAND gate configured to generate the first bias signal, the logic NAND gate receiving the complement of the first input signal and the complement of the first output signal as inputs; and further comprising a logic inverter gate having an input coupled to an output of the logic NAND gate, the logic inverter configured to generate the complement of the first bias signal.

18. The circuit of claim 14, wherein the first bias signal is generated by a logic NAND gate receiving the complement of the first input signal and complement of the first output signal as inputs.

19. The circuit of claim 14, wherein the first input transistor has a body biased by the first bias signal.

20. A circuit, comprising:
a level shifting circuit configured to receive a first input signal referenced to a first power supply domain and output a first output signal referenced to a second power supply domain, wherein the level shifting circuit comprises:
a first input transistor having a gate terminal receiving the first input signal; and
a cascode transistor coupled in series with the first input transistor, said cascode transistor having a gate terminal coupled to receive the first output signal and having a body terminal configured to receive a first bias signal; and
a bias generator having a first input configured to receive the first input signal and a second input configured to receive the first output signal, said bias generator configured to generate the first bias signal in response to a logical combination of the first input signal and the first output signal.

21. The circuit of claim 20, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

22. The circuit of claim 20, wherein the level shifting circuit further includes a current mirror circuit coupled to the cascode transistor, said current mirror circuit including a transistor having a body terminal configured to receive a complement of the first bias signal.

23. The circuit of claim 22, wherein the bias generator operates to respond to a change in logic state of the first input signal by driving the first bias signal from a lower voltage level toward a higher voltage level for a duration of time which is terminated by a change in logic state of the first output signal, and wherein after termination of said duration of time the bias generator operates to drive the first bias signal back to the lower voltage level.

24. The circuit of claim 22, wherein the bias generator comprises a logic NAND gate configured to generate the first bias signal, the logic NAND gate receiving the first input signal and first output signal as inputs; and further comprising a logic inverter gate having an input coupled to an output of the logic NAND gate, the logic inverter configured to generate the complement of the first bias signal.

25. The circuit of claim 20, wherein the first bias signal is generated by a logic NAND gate receiving the first input signal and first output signal as inputs.

26. The circuit of claim 20, wherein the first input transistor has a body biased by the first bias signal.

27. A circuit, comprising:
a level shifting circuit configured to receive a first input signal and a complement of the first input signal which are referenced to a first power supply domain and output a first output signal and a complement of the first output signal which are referenced to a second power supply domain, wherein the level shifting circuit comprises:
a first input transistor having a gate terminal receiving the complement of the first input signal;
a current mirror circuit having a first leg coupled to the first input transistor and having a second leg; and
a p-channel transistor having a gate terminal coupled to the first leg and a drain terminal coupled to the second leg, said p-channel transistor further having a body terminal configured to receive a complement of a first bias signal; and
a bias generator having a first input configured to receive the complement of the first input signal and a second input configured to receive the complement of the first output signal, said bias generator configured to generate the first bias signal in response to a logical combination of the complement of the first input signal and the complement of the first output signal.

28. The circuit of claim 27, wherein the bias generator operates to respond to a change in logic state of the first input signal by driving the first bias signal from a lower voltage level toward a higher voltage level for a duration of time which is terminated by a change in logic state of the complement of the first output signal, wherein after termination of said duration of time the bias generator operates to drive the first bias signal back to the lower voltage level.

29. The circuit of claim 27, wherein the bias generator comprises a logic NAND gate configured to generate the first bias signal, the logic NAND gate receiving the complement of the first input signal and the complement of the first output signal as inputs; and further comprising a logic inverter gate having an input coupled to an output of the logic NAND gate, the logic inverter configured to generate the complement of the first bias signal.

30. The circuit of claim 27, wherein the first bias signal is generated by a logic NAND gate receiving the complement of the first input signal and complement of the first output signal as inputs.

31. The circuit of claim 27, wherein the first input transistor has a body biased by the first bias signal.

* * * * *